United States Patent [19]

Gibson

[11] Patent Number: 5,939,944
[45] Date of Patent: Aug. 17, 1999

[54] NPN PUSH-PULL OUTPUT STAGE WITH FOLDED CASCODE JFETS

[75] Inventor: Gary S. Gibson, Tucson, Ariz.

[73] Assignee: Burr-Brown Corporation, Tucson, Ariz.

[21] Appl. No.: 08/991,386

[22] Filed: Dec. 16, 1997

[51] Int. Cl.[6] .............................. H03F 3/26; H03F 3/45
[52] U.S. Cl. ......................... 330/255; 330/292; 330/300
[58] Field of Search ................................. 330/151, 255, 330/262, 271, 344, 292, 300

[56] References Cited

U.S. PATENT DOCUMENTS

| | | | |
|---|---|---|---|
| 3,562,660 | 2/1971 | Pease | 330/255 X |
| 4,403,200 | 9/1983 | Davis | 330/294 |
| 4,553,106 | 11/1985 | Vyne | 330/272 |
| 4,829,266 | 5/1989 | Pernici et al. | 330/253 |
| 4,959,622 | 9/1990 | Kearney | 330/257 |
| 4,963,834 | 10/1990 | Yukawa | 330/253 |
| 5,168,243 | 12/1992 | Feliz et al. | 330/252 |
| 5,376,897 | 12/1994 | Yoshino et al. | 330/252 |
| 5,420,542 | 5/1995 | Harvey | 330/292 |
| 5,500,625 | 3/1996 | Rincon et al. | 330/273 |
| 5,557,238 | 9/1996 | Weiss | 330/258 |
| 5,598,129 | 1/1997 | Chambers | 330/255 |

OTHER PUBLICATIONS

"Power Op Amps Sport Rail–to–Rail I/O Control Up To 3 A At 70 V" by Frank Goodenough, Electronic Design, May 1, 1997, two pages.

*Primary Examiner*—Steven J. Mottola
*Attorney, Agent, or Firm*—Cahill, Sutton & Thomas P.L.C.

[57] ABSTRACT

A push-pull output stage includes an NPN pull-up transistor (Q6) and an NPN pull-down transistor (Q7) connected to an output. A compensation capacitor 17 is coupled between the collector and base of the pull-down transistor. A differential input stage includes emitter-coupled first (Q2) and second (Q3) NPN input transistors each coupled by a degeneration resistor to a constant current source. A base of the first NPN input transistor (Q2) is coupled to receive a shifted input voltage ($V_{IN}$), and a base of the second NPN input transistor is coupled to the output conductor (3). The collectors of the first (Q2) and second (Q3) input transistors are connected to the sources of a folded cascode circuit including first (J1) and second (J2) cascode P-channel JFETs, respectively, the drains of which are connected to a current mirror output transistor (Q5) and a current mirror control transistor (Q4), respectively. The collector of the current mirror output transistor (Q5) is connected to the base of the pull-down transistor (Q7). The voltage gain of the output stage is determined primarily by the degeneration resistors and the compensation capacitor and hence is quite independent of the load impedance, and therefore provides stable circuit operation. A shoot-through current limiting circuit includes a capacitor and a resistor coupled between the input ($V_{IN}$) and the base and collector of the current mirror control transistor (Q4).

17 Claims, 3 Drawing Sheets

5,939,944

NPN PUSH-PULL OUTPUT STAGE WITH FOLDED CASCODE JFETS

BACKGROUND OF THE INVENTION

The invention relates to amplifier output stages having NPN transistors but no lateral PNP transistors in the AC signal path from the input to the output, and more particularly to a fast, stable NPN push-pull output circuit which can produce output voltage levels close to the positive and negative power supply voltages.

FIG. 1A hereof shows a typical prior art push-pull output circuit including an NPN pull-up transistor 21 having its collector connected to $V_{DD}$, its emitter connected to an output voltage conductor 3 on which an output voltage $V_{OUT}$ is produced, and its base connected by a conductor 22 to the junction between a constant current source 25 and to the anode of a diode 23, the cathode of which is connected to the anode of a diode 24. The cathode of diode 24 is connected by a conductor 2 to the base of a PNP pull-down transistor 20 in a pull-down circuit 20A. The collector of pull-down transistor 20 is connected to ground. A constant current source 25 is connected between conductor 22 and $+V_{DD}$. (Note that input voltage $V_{IN}$ can be applied either to conductor 2 or conductor 22.) FIG. 1B shows that in the push-pull circuit of FIG. 1A the pull-down circuit 20A can include PNP transistor 20 with its collector connected to the base of an NPN pull-down transistor 26 having its emitter connected to ground and its collector connected to output conductor 3. Yet another known output stage is disclosed in U.S. Pat. No. 4,403,200 by Davis.

It has been recognized in the prior art that the circuit shown in FIG. 1B can be diagrammed generally as shown in FIG. 1C, wherein a differential transconductance amplifier 18 has a (−) input coupled by conductor 2 to receive the input voltage $V_{IN}$ and to the cathode of a single diode 23, the anode of which is connected to conductor 22. The (+) input of differential amplifier 18 is connected by conductor 3 to receive the output voltage $V_{OUT}$. The output of differential amplifier 18 is connected to the base of a pull-down NPN output transistor 26 which constitutes pull-down circuit 20A.

Those skilled in the art know that capacitive loading can produce instability of the pull-up and pull-down transistors, especially the NPN pull-down transistor. This is because the gain of the output stage while sinking current is a function of the output load impedance. In the above prior art circuits of FIGS. 1B and 1C the gain-bandwidth product is linearly dependent on the capacitive output load, or more generally, on the load impedance. Consequently, circuit instability can be caused by large capacitive loads, and the resulting oscillations in the output stages of FIGS. 1B and 1C introduce distortion into the output signal. To obtain stable, reliable circuit operation, it is desirable that the voltage gain of the output stage be determined mainly by design parameters, and hence be fairly independent of the load impedance.

Some known high-speed operational amplifiers, such as the assignee's OPA650, use a gain stage that includes a differential NPN input stage followed by "folded cascode" PNP transistors connected to an NPN current mirror. The current mirror then drives a separate, distinct output stage that includes a diamond follower circuit. The details of such an operational amplifier are set forth in the assignee's allowed pending patent application "STABLE BIAS CURRENT CIRCUIT FOR OPERATIONAL AMPLIFIER", Ser. No. 08/710,632, filed Sep. 18, 1996 by Douglas Smith, now U.S. Pat. No. 5,786,729, issued Jul. 28, 1998, incorporated herein by reference. The PNP folded cascode transistors of the gain stage of the above-mentioned OPA 650 operational amplifier are "vertical" PNP transistors, which cannot be provided in typical inexpensive bipolar integrated circuit manufacturing processes.

Only lateral PNP transistors, not vertical PNP transistors, can be provided in typical low-cost bipolar integrated circuit manufacturing processes, such as processes which produce the integrated circuit structure shown on page 145 of "ANALYSIS ND DESIGN OF ANALOG INTEGRATED CIRCUITS", third edition, by Paul R. Gray and Robert G. Meyer, 1993, John Wiley & Sons, Inc., entirely incorporated herein by reference. However, lateral PNP transistors are far too slow to be used in the AC signal path of a high frequency amplifier gain stage or output stage.

Many prior art operational amplifiers are manufactured using relatively low cost, well known manufacturing processes wherein the only PNP transistors (other than "substrate" PNP transistors) that can be constructed are "lateral" PNP transistors. Lateral PNP transistors have very low bandwidth compared to vertical NPN or PNP transistors. Therefore, lateral PNP transistors can not be used in the AC signal path of a high speed amplifier or output stage thereof. However, there is an unmet need for a high bandwidth amplifier output stage that includes a differential input stage which includes a pair of NPN input transistors but uses no PNP transistors, especially lateral PNP transistors, in the AC signal path. There also is a need for avoiding "shoot-through" current in the NPN pull-up transistor and the NPN pull-down transistor of such a circuit.

SUMMARY OF THE INVENTION

Accordingly, it is an object of the invention to provide a high speed, low cost bipolar transistor output circuit stage which produces an output signal that swings close to both the negative and positive power supply voltages.

It is another object of the invention to provide a high speed implementation of the prior art circuit shown in FIG. 1C without use of any PNP transistors, especially lateral PNP transistors, in the AC signal path.

It is another object of the invention to provide a high bandwidth push-pull output stage which avoids "shoot-through" currents in the pull-up and pull-down transistors.

It is another object of the invention to provide an "all NPN" output stage, the voltage gain of which is determined primarily by design values of circuit components of the output stage and therefore is independent of load impedance.

Briefly described, and in accordance with one embodiment thereof, the invention provides a push-pull output stage including a pull-up transistor (Q6) and a pull-down transistor (Q7), a base of the pull-up transistor being coupled to receive an input signal ($V_{IN}$), an emitter of the pull-up transistor and a collector of the pull-down transistor being coupled to an output conductor (3) to produce thereon an output signal ($V_{OUT}$), a transconductance amplifier having a differential input stage including first (Q2) and second (Q3) input transistors having their emitters coupled to a first constant current source (10), a base of the first input transistor (Q2) being coupled to receive the input voltage ($V_{IN}$), shifted down by one $V_{be}$, a base of the second input transistor being coupled to the output conductor (3), and a folded cascode circuit including first (J1) and second (J2) cascode FETs and a current mirror circuit including a control transistor (Q4) and an NPN transistor (Q5), sources of the first and second cascode FETs being coupled to collectors of the first (Q2) and second (Q3) input transistors, respectively, a drain of the first cascode FET (J1) being coupled to a collector of the current mirror output transistor (Q5), a drain of the second cascode FET (J2) being coupled to a collector of the control transistor (Q4) and to bases of the control transistor (Q4) and the current mirror output transistor (Q5), a drain of the first cascode FET (J1) being coupled to a base of the pull-down transistor (Q7). In the described embodiment, the bipolar transistors all are NPN transistors, and the first and second cascode FETs are P-channel junction field effect transistors. A compensation capacitor (C1) is coupled between the collector and base of the pull-down transistor (Q7). The base of the first input transistor (Q2) is coupled to receive the input voltage by means of a diode-connected NPN level shift transistor (Q1) having an emitter connected to the base of the first input transistor (Q2) and to a second current source (IB1). The input voltage ($V_{IN}$) is connected directly to the base of the pull-up transistor (Q6) by means of a conductor (2). The differential input stage includes first (28) and second (27) current sources coupled to the collectors of the first and second input transistors, respectively. A circuit for limiting shoot-through currents in the NPN pull-up transistor (Q6) and the NPN pull-down transistor (Q7) includes a capacitor (C2) coupled between a conductor 2 carrying the input voltage ($V_{IN}$) and a first terminal of a resistor (15), a second terminal of the resistor being coupled to the collector and base of the current mirror control transistor (Q4). The capacitances of the capacitor (C2) and the compensation capacitor (C1) and the resistance of the resistor (15) are selected to minimize "shoot-through" currents through the NPN pull-up and NPN pull-down transistors at signal frequencies.

DETAILED DESCRIPTION OF THE PREFERRED EMBODIMENT

By way of definition, it is intended that the term "output stage" is used herein to refer to a push-pull output circuit having approximately unity voltage gain. The structure and operation of an output stage are distinct from and different from that of a gain stage of an amplifier such as an operational amplifier.

Figure 1A:
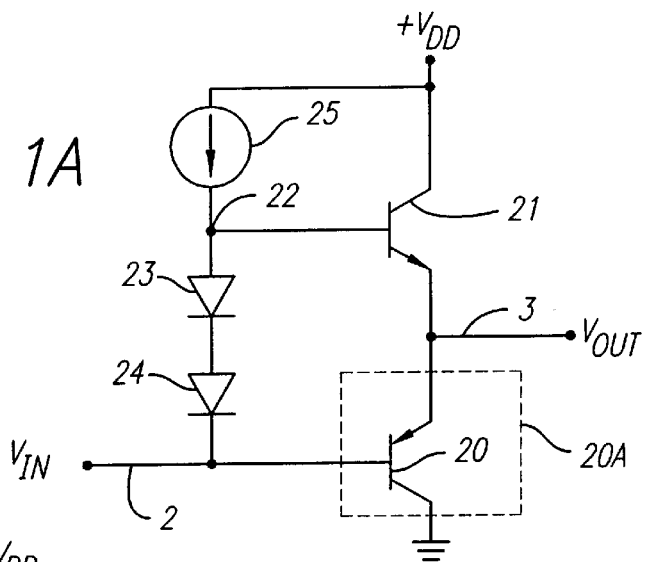
FIG. 1A is a circiut schematic of a prior art push-pull output stage.
Figure 1B:
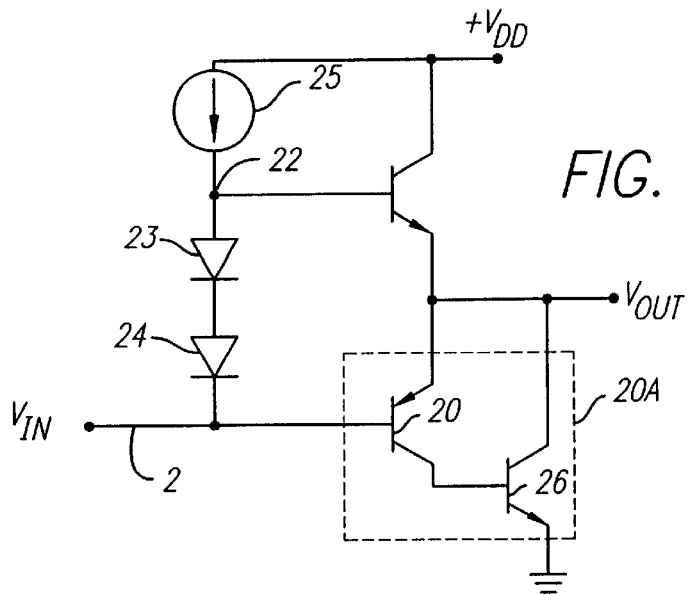
FIG. 1B is a schematic diagram of a modified prior art output push-pull which is a modification of the circuit of FIG. 1A.
Figure 1C:
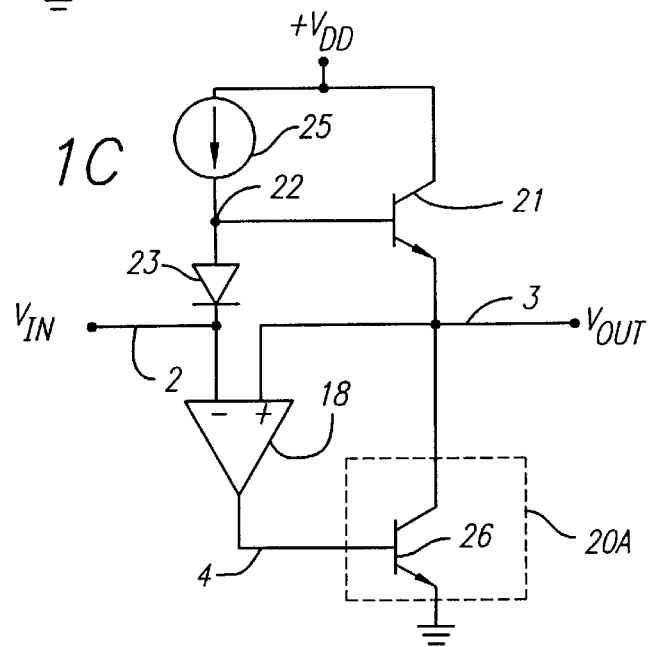
FIG. 1C is a schematic diagram of a generalized push-pull output stage which is a helpful in understanding the operation of the prior art circuit of FIG. 1B.
Figure 2A:
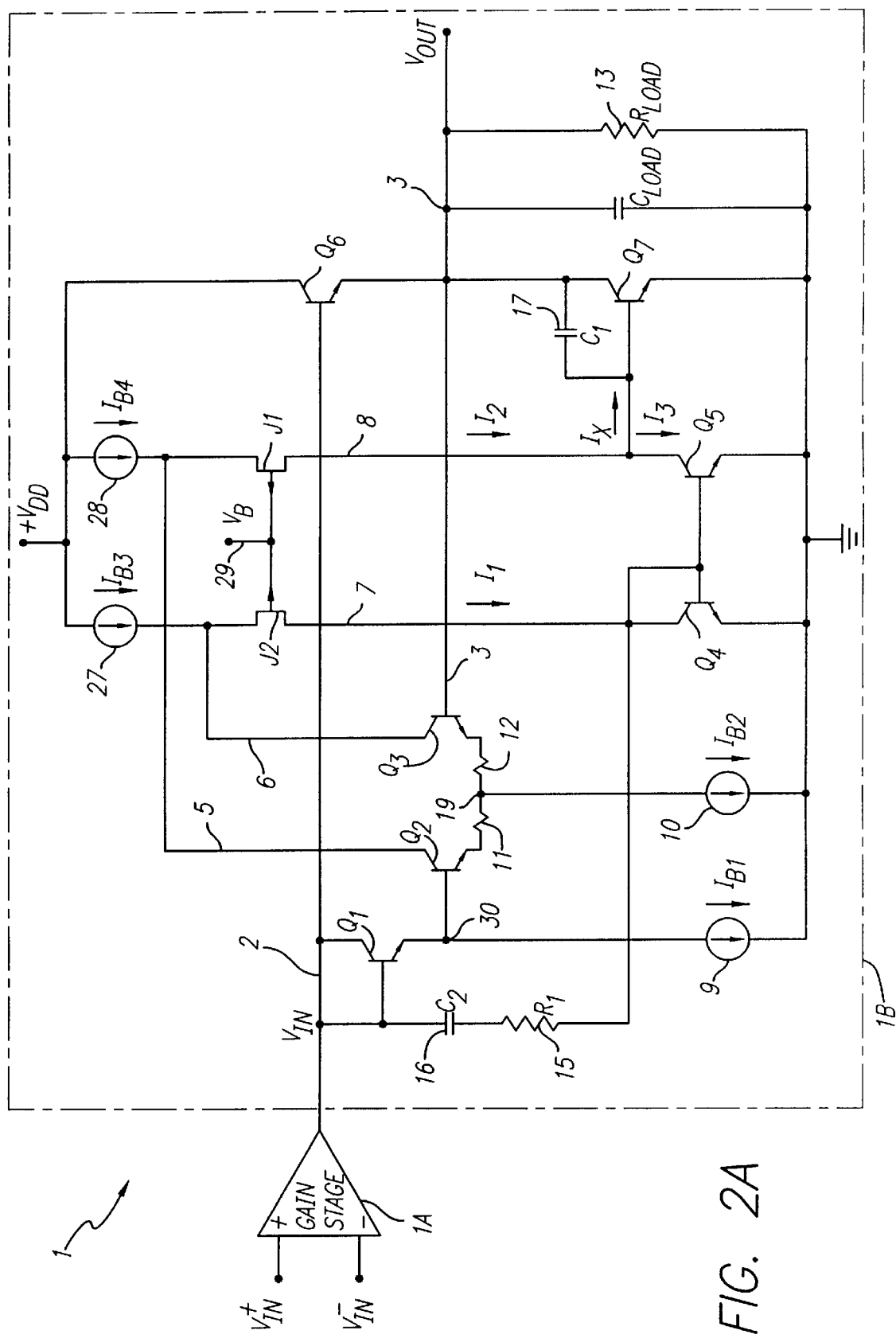
FIG. 2A is a detailed schematic diagram of a preferred embodiment of the present invention.

Referring to FIG. 2A, amplifier output stage 1 includes an input terminal 2 to which an input voltage $V_{IN}$ is applied. $V_{IN}$ is produced by a differential gain stage 1A having $V_{IN}{}^+$ and $V_{IN}{}^-$ applied to its (+) and (−) inputs, respectively. Conductor 2 is connected to the base and collector of an NPN level shift transistor Q1 and to the base of an NPN pull-up transistor Q6. The emitter of transistor Q6 is connected to an output conductor 3 on which an output voltage $V_{OUT}$ is produced. The collector of pull-up transistor Q6 is connected to +$V_{DD}$. Output conductor 3 also is connected to the collector of an NPN pull-down transistor Q7, the emitter of which is connected to ground. A Miller feedback capacitor 17 of capacitance C1 is connected between the collector and base of pull-down transistor Q7.

Figure 2B:
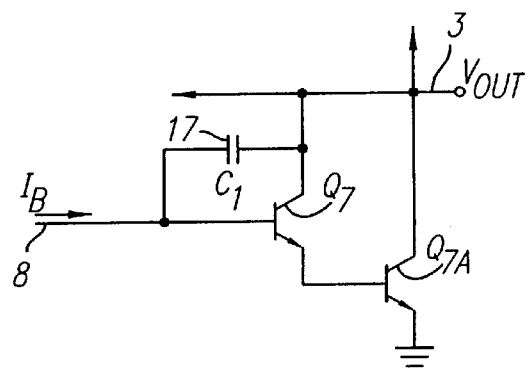
FIG. 2B is a schematic diagram which illustrates an alternative connection of transistor Q7 of FIG. 2A to provide an NPN Darlington pull-dow circuit.

FIG. 2B illustrates how transistor Q7 of FIG. 2A can have it's emitter connected to the base of an NPN transistor Q7A having it's emitter connected to ground and it's collector connected to output conductor 3 to provide a Darlington pull-down transistor circuit. Alternatively, the collector of transistor Q7 could be connected to +$V_{DD}$ instead of to conductor 3. Compensation capacitor 17, however, must be connected between conductors 3 and 8. In FIG. 2A a load capacitor having a capacitance $C_{LOAD}$ and a load resistor 13 of resistance $R_{LOAD}$ are connected between output conductor 3 and ground.

The emitter of level shift transistor Q1 is connected by conductor 30 to the base of an NPN input transistor Q2 of a differential amplifier stage including NPN input transistor Q3, constant current source 10, and constant current sources 27 and 28 which act as collector loads. Conductor 30 also is connected to a constant current source 9 which produces a constant current $I_{B1}$. The emitter of input transistor Q2 is coupled by a degeneration resistor 11 to conductor 19, which is coupled by an emitter degeneration resistor 12 to the emitter of input transistor Q3, the base of which is connected to output conductor 3.

Degeneration resistors 11 and 12 may have resistances of approximately 5 kilohms, depending upon the bias current level chosen for $I_{B2}$. The resistances of degeneration resistors 11 and 12 are selected to determine the gain-bandwidth product of the secondary output loop including transistors Q7 and Q7A and compensation capacitor 17. Constant current source 10 produces a current $I_{B2}$, and is coupled between conductor 19 and ground. The other terminal of constant current source 9 also is connected to ground.

The collector of input transistor Q2 is connected by conductor 5 to one terminal of constant current source 28 and to the source electrode of a P-channel junction field effect transistor (JFET) J1. The other terminal of constant current source 28 is connected to +$V_{DD}$. The drain of JFET J1 is connected by conductor 8 to the base of an NPN pull-down transistor Q7. Similarly, the collector of input transistor Q3 is connected by conductor 6 to one terminal of constant current source 27 and to the source electrode of a P-channel JFET J2. The other terminal of constant current source 27 is connected to +$V_{DD}$. (Typically, current sources 27 and 28 are implemented using PNP current mirror circuits; current sources 9 and 10 are implemented using NPN current mirror circuits). Conductor 8 also is connected to the collector of an NPN current mirror output transistor Q5, the emitter of which is connected to ground.

The gate electrodes of JFETs J1 and J2 are connected by conductor 29 to receive a bias voltage $V_B$, so they function as cascode transistors. The drain electrode of cascode JFET J2 is connected by conductor 7 to the collector and base of an NPN current mirror control transistor Q4 and to the base of NPN current mirror output transistor Q5. The emitters of transistors Q4 and Q5 are connected to ground.

$V_{IN}$ conductor 2 is connected to one plate of a feed-forward capacitor 16 having a capacitance C2. The other plate of capacitor 16 is connected to a resistor 15 having a resistance R1. The other terminal of resistor 15 is connected to conductor 7. Capacitor 16 and resistor 15 function to limit "shoot-through" current in pull-up transistor Q6 and pull-down transistor Q7, as subsequently explained. Note that the positions of capacitor 16 and resistor 15 could be reversed.

The operation of the circuit shown in FIG. 2A can be understood by considering the situation in which pull-up transistor Q6 provides a large current to supply load resistor 13. In this case, the $V_{BE}$ voltage of transistor Q6 is more than its normal low current value. The $V_{BE}$ voltage of transistor Q1 is independent of the load current in the load resistor 13, so conductor 3 will be at a significantly lower voltage than conductor 30. This voltage difference between the base electrodes of differential input transistors Q2 and Q3 leads to an increase in the collector current of transistor Q2 through conductor 5 and a decrease in the collector current of transistor Q3 through conductor 6.

The increase in the current through conductor 5 into the collector of transistor Q2 results in a decreased amount of the constant current $I_{B4}$ flowing through the source and drain of JFET J1. Consequently, the current $I_2$ flowing through conductor 8 decreases. This decreases the current $I_X$ flowing into the base of pull-down transistor Q7. That decreases the collector current of pull-down transistor Q7. The result is that more of the current flowing through the emitter of pull-up transistor Q6 flows into load resistor 13 instead of into the collector of pull-down transistor Q7, tending to bring the voltage $V_{OUT}$ on conductor 3 up to the same voltage being applied by transistor Q1 to the base of differential input transistor Q2 through conductor 30.

At the same time, the above mentioned decrease in the current flowing through conductor 6 in the collector of differential input transistor Q3 increases the amount of the constant current $I_{B3}$ that is available to flow through the source and drain of JFET J2, increasing the current I1. The increased current I1 is mirrored by current mirror circuit Q4,Q5, increasing the current I3 flowing through the collector of current mirror output transistor Q5. The increase in I3 subtracts from the amount of the current I2 that contributes to the base current $I_X$ of pull-down transistor Q7, thereby further decreasing its collector current, causing still more of the current through the emitter of pull-up transistor Q6 to supply load resistor 13, rather than flowing into the collector of pull-down transistor Q7.

If the output stage 1 shown in FIGS. 2A and 2B is operated to slew $V_{OUT}$ down to a lower level, then $V_{OUT}$ will be higher than the voltage applied on conductor 30 to the base input of differential input transistor Q2, and the above operation is reversed, so that the current $I_X$ flowing into the base of pull-down transistor Q7 is increased, thus turning Q7 on harder and pulling the output conductor 3 to a lower level.

Another way of considering the operation of the circuit of FIGS. 2A and 2B is to recognize that if a differential voltage between conductors 30 and 3 is applied to the bases of NPN input transistors Q2 and Q3, this results in a corresponding differential current I2–I3=$I_X$ which appears as a variable current source flowing into the junction between the base of pull-down transistor Q7 and compensation capacitor 17. A first transfer function then is the ratio of $\Delta I_X/\Delta V_{NPN}$, where $\Delta V_{NPN}$ is a differential input voltage applied between conductors 3 and 30.

A second transfer function $\Delta V_{OUT}/\Delta I_X$ also can be determined, and the voltage gain $\Delta V_{OUT}/\Delta V_{IN}$ of the output stage 1 is the product of the first and second transfer functions. Note that almost all of the AC differential current $I_X$ flows through compensation capacitor 17. The circuit including compensation capacitor 17 and either NPN pull-down transistor Q7 as shown in FIG. 2A or the Darlington output stage including transistors Q7 and Q7A as shown in FIG. 2B, is nearly an ideal current-to-voltage converter having a frequency response similar to that of an integrator functioning as a high gain circuit, with a single dominant pole roll-off characteristic.

In the circuit of FIGS. 2A and 2B, the voltage-to-current gain between the differential voltage applied between the bases of NPN input transistors Q2 and Q3 and the variable current source $I_X$ is primarily determined by the values of the degeneration resistors 11 and 12, which, as mentioned above, can be approximately 5 kilohms. The current-to-voltage gain of the circuitry including compensation capacitor 17 and pull-down transistor Q7 or Darlington circuit Q7, Q7A of FIG. 2B is determined primarily by the capacitance C1 of compensation capacitor 17. Therefore, the voltage gain $V_{OUT}/V_{IN}$ of the output stage is equal to the product of the above described first and second two "controllable" gains, and is fairly independent of the load impedance, especially in the case where a Darlington pull-down circuit as shown in FIG. 2B is used, wherein a very large $\Delta I_{OUT}$, and hence a large $\Delta V_{OUT}$ can be produced with a very small voltage change on the base of transistor Q7.

The circuit of FIGS. 2A and 2B overcomes the above-described problem of the closest prior art output stages, wherein the gain is determined more by the load impedance. This provides a significant advantage over the closest prior art, wherein the disadvantages of using PNP transistors are avoided by circuit configurations which eliminate PNP transistors, especially lateral PNP transistors, but do not provide voltage gain transfer characteristics which are substantially independent of the load impedance.

The operation of above mentioned feed-forward capacitor 16 to limit shoot-through current is explained next. During rapid positive slewing, the voltage $V_{OUT}$ on conductor 3 rapidly increases. This causes rapid charging of compensation capacitor $C_1$. Such charging of compensation capacitor C1 causes a current to be injected via $C_1$ into conductor 8, which is clamped at $V_{BE}$ volts above ground by the forward-biased base-emitter junction pull-down transistor Q7. If the voltage on conductor 8 is allowed to increase slightly due to the injected current, transistor Q7 turns on harder, limiting the increase of $V_{OUT}$ and causing an increase in the base current of pull-down transistor Q7. That increase in base current is multiplied by the current gain $\beta$ of pull-down transistor Q7 and causes a large increase in the collector current of pull-down transistor Q7 (which constitutes the "shoot through" current). To prevent the voltage on conductor 8 from such an increase, the current I3 through current mirror output transistor Q5 must increase so as to sink the above mentioned charging current injected into conductor 8 by compensation capacitor C1.

As another way to understand the operation, it is helpful to first consider how the circuit would operate without feed-forward capacitor C2. Without feed-forward capacitor C2, if $I_3$ is to increase, $I_1$ must first increase. But for $I_1$ to increase, the voltage applied by conductor 30 to the base of transistor Q2 must increase relative to the voltage $V_{OUT}$ on the base of transistor Q3. Since this voltage difference also increases the voltage across the base-emitter junction of pull-up transistor Q6, it tends to increase the current through pull-up transistor Q6. Pull-down transistor Q7 then absorbs this extra current, which constitutes additional "shoot-through" current.

This undesirable result can be prevented by injecting an additional feed-forward current into conductor 7, which is what is accomplished by the circuitry including feed-forward capacitor C2 and resistor R1. By injecting a feed-forward current into conductor 7 that tracks the current injected into conductor 8 by compensation capacitor $C_1$ during positive slewing, $I_3$ can be increased without increasing $I_1$. Consequently, the voltage between the bases of input transistors Q2 and Q3 is not required to increase, so the base-to-emitter voltage of pull-up transistor Q6 does not have to increase unduly, and the "shoot-through" current in pull-up transistor Q6 and pull-down transistor Q7 is eliminated if the feed-forward capacitor C2 is equal to the compensation capacitor C1. Resistor R1 acts to limit the foregoing operation at high frequencies above the desired signal frequency, to thereby prevent instability that might otherwise occur.

The above described output stage provides the advantages of an output voltage swing between an upper limit of one $V_{BE}$ voltage below +VDD and one $V_{CE(sat)}$ above the ground voltage. Because no PNP transistors are included anywhere in the AC signal path, and because the P-channel cascode JFETs J1 and J2 are used to "turn around" the collector currents of the differential input transistors Q2 and Q3, the desired high bandwidth is achieved. The result is the above mentioned very good high bandwidth amplifier with a wide output voltage swing.

The present invention also allows use of the above-mentioned low cost conventional bipolar process or a biCMOS process which does not have the capability of providing high speed "vertical" PNP transistors to implement a fast transconductance amplifier having very high gain-bandwidth product.

Another advantage of the above described circuit is that it operates in the class AB mode, wherein only one of transistors Q6 and Q7 can be off at a particular time, preventing the distortion that can otherwise occur.

While the invention has been described with reference to several particular embodiments thereof, those skilled in the art will be able to make the various modifications to the described embodiments of the invention without departing from the true spirit and scope of the invention. It is intended that all elements and steps which are insubstantially different or perform substantially the same function in substantially the same way to achieve the same result as what is claimed are within the scope of the invention.

Figure 3A:
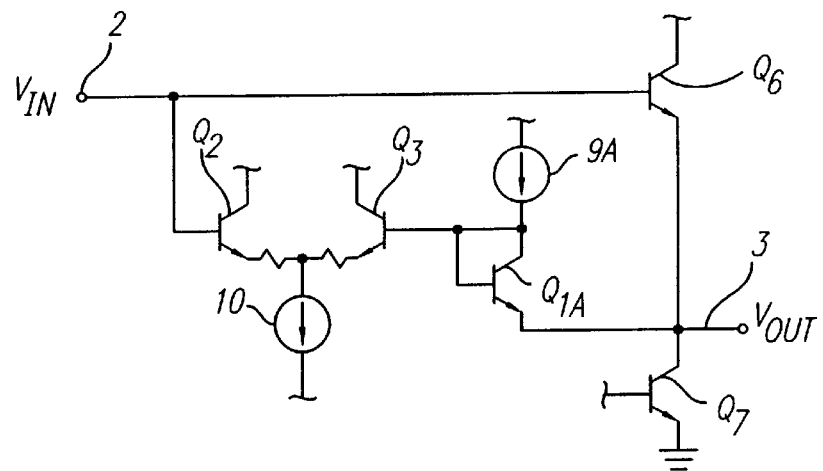
FIG. 3A is a partial schematic diagram of a modified embodiment of the invention.
Figure 3B:
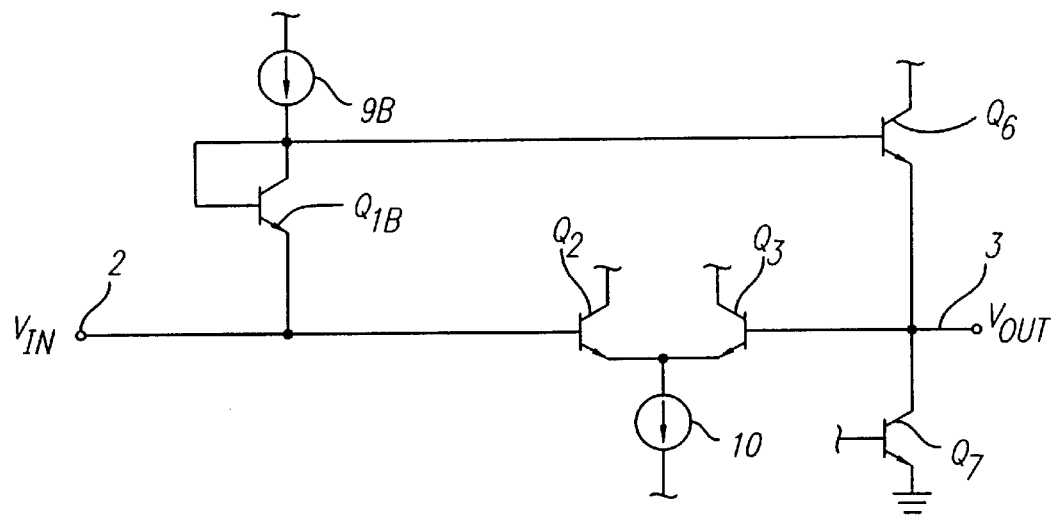
FIG. 3B is a partial schematic diagram of another modified embodiment of the invention.

For example, the $V_{BE}$ level shift provided by transistor Q1 and current source 9 in FIG. 2A to match the $V_{BE}$ voltage of transistor Q6 can be provided at other locations of the loop including transistors Q1, Q2, Q3, and Q6. For example, in FIG. 3A, diode-connected NPN transistor Q1A and current source 9A provide the required level shift between the base of NPN input transistor Q3 and $V_{OUT}$ conductor 3. In FIG. 3B, the level shift function is provided by diode-connected NPN transistor Q1B and current source 9B between $V_{IN}$ conductor 2 and the base of NPN pull-up transistor Q6. If a Darlington output circuit is used to replace pull-up transistor Q6, then, of course, the $V_{BE}$ level shifts must be replace by $2V_{BE}$ level shifts.

What is claimed is:

1. A push-pull output stage, comprising in combination:
   (a) an NPN pull-up transistor and an NPN pull-down transistor, a base of the NPN pull-up transistor being coupled to respond to an input signal, an emitter of the NPN pull-up transistor and a collector of the NPN pull-down transistor being coupled to an output conductor to produce thereon an output signal;
   (b) a differential input circuit including first and second NPN input transistors having their emitters coupled to a first constant current source, a base of the first NPN input transistor being coupled to respond to the input voltage, a base of the second NPN input transistor being coupled to respond to the output conductor; and
   (c) a folded cascode circuit including first and second cascode FETs and a current mirror circuit including an NPN control transistor and an NPN current mirror output transistor, sources of the first and second cascode FETs being coupled to collectors of the first and second NPN input transistors, respectively, a drain of the second cascode FET being coupled to a collector of the control transistor and to bases of the control transistor and the output transistor of the current mirror circuit, a drain of the first cascode FET being coupled to a base of the NPN pull-down transistor and a collector of the output transistor of the current mirror circuit.

2. The push-pull output stage of claim 1 wherein a voltage-to-current gain of a portion of the output stage including the differential input circuit and the folded cascode circuit is determined primarily by resistances of a first degeneration resistor and a second degeneration resistor coupled between the first constant current source and the emitters of the first and second NPN input transistors, respectively.

3. The push-pull output stage of claim 2 further including a compensation capacitor coupled between the collector and base of the NPN pull-down transistor.

4. The push-pull output stage of claim 3 wherein a current-to-voltage gain of a portion of the output stage including the NPN pull-up transistor, the NPN pull-down transistor, and the compensation capacitor is determined primarily by the capacitance of the compensation capacitor.

5. The push-pull output stage of claim 4 wherein the first and second cascode FETs are P-channel junction field effect transistors.

6. The push-pull output stage of claim 5 wherein the base of the first NPN input transistor is coupled to respond to the input voltage by means of an NPN level shift transistor.

7. The push-pull output stage of claim 6 wherein the input voltage is connected directly to the base of the NPN pull-up transistor by means of a conductor.

8. The push-pull output stage of claim 7 wherein the differential input circuit includes first and second current sources coupled to the collectors of the first and second NPN input transistors, respectively.

9. The push-pull output stage of claim 8 wherein an emitter of the level shift transistor is coupled to a second constant current source.

10. The push-pull output stage of claim 5 including a circuit for limiting shoot-through currents in the NPN pull-up transistor and the NPN pull-down transistor, the shoot-through current limiting circuit including a feed-forward capacitor coupled between a conductor responsive to the input signal and the base of the control transistor of the current mirror circuit.

11. The push-pull output stage of claim 10 including a resistor coupled in series with the feed-forward capacitor between the conductor responsive to the input signal and the base of the control transistor of the current mirror circuit.

12. The push-pull output stage of claim 11 wherein the capacitances of the capacitor and the compensation capacitor and the resistance of the resistor are selected to prevent shoot-through current in the pull-up transistor and pull-down transistor.

13. A push-pull output stage, comprising in combination:
   (a) a pull-up transistor and a pull-down transistor, a base of the pull-up transistor being coupled to respond to an input signal, an emitter of the pull-up transistor and a collector of the pull-down transistor being coupled to an output conductor to produce thereon an output signal;

(b) a differential input circuit including first and second input transistors having their emitters coupled to a first constant current source, a base of the first input transistor being coupled to respond to the input voltage, a base of the second input transistor being coupled to respond to the output conductor; and (c) a folded cascode circuit including first and second cascode FETs and a current mirror circuit including an NPN control transistor and an NPN output transistor, sources of the first and second cascode FETs being coupled to collectors of the first and second NPN input transistors, respectively, a drain of the second cascode FET being coupled to a collector of the control transistor of the current mirror circuit and to bases of the control transistor and the output transistor of the current mirror circuit, a drain of the first cascode FET being coupled to a base of the pull-down transistor and a collector of the output transistor of the current mirror circuit.

14. The push-pull output stage of claim 13 wherein the base of the first input transistor is coupled to respond to the input voltage by means of a level shift transistor.

15. The push-pull output stage of claim 13 wherein the first and second cascode FETs are junction field effect transistors.

16. The push-pull output stage of claim 14 wherein the input voltage is connected directly to the base of the pull-up transistor by means of a conductor.

17. A method of providing a push-pull output stage, comprising the steps of:

(a) providing a differential input circuit including
  (i) first and second NPN input transistors having their emitters coupled to a first constant current source, a base of the first NPN input transistor being coupled to respond to an input voltage, a base of the second NPN input transistor being coupled to an output conductor, and
  (ii) a folded cascode circuit including first and second cascode FETs and a current mirror circuit including an NPN control transistor and an NPN output transistor, sources of the first and second cascode FETs being coupled to collectors of the first and second NPN input transistors, respectively, a drain of the second cascode FET being coupled to a collector of the control transistor of the current mirror circuit and to bases of the control transistor and the output transistor of the current mirror circuit, a drain of the first cascode FET being coupled to collector of the output transistor of the current mirror circuit;

(b) determining a voltage-to-current gain of a portion of the output stage including the differential input circuit and the folded cascode circuit primarily by coupling a first degeneration resistor and a second degeneration resistor between the first constant current source and the emitters of the first and second NPN input transistors respectively;

(c) providing an NPN pull-up transistor and an NPN pull-down transistor, a base of the NPN pull-up transistor being coupled to respond to an input signal, an emitter of the NPN pull-up transistor and a collector of the NPN pull-down transistor being coupled to the output conductor to produce thereon an output signal; and (d) determining a current-to-voltage gain of a portion of the output stage including the NPN pull-up transistor, the NPN pull-down transistor, primarily by coupling a compensation capacitor between the output conductor and base of the NPN pull-down transistor.

* * * * *